(12) United States Patent
Gomi et al.

(10) Patent No.: US 9,551,060 B2
(45) Date of Patent: Jan. 24, 2017

(54) FILM FORMING APPARATUS AND FILM FORMING METHOD

(71) Applicant: Tokyo Electron Limited, Tokyo (JP)

(72) Inventors: Atsushi Gomi, Yamanashi (JP); Kanto Nakamura, Yamanashi (JP); Tooru Kitada, Yamanashi (JP); Yasunobu Suzuki, Yamanashi (JP); Shinji Furukawa, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/810,239

(22) Filed: Jul. 27, 2015

(65) Prior Publication Data

US 2016/0032446 A1 Feb. 4, 2016

(30) Foreign Application Priority Data

Jul. 31, 2014 (JP) ................. 2014-156547

(51) Int. Cl.

| C23C 14/34 | (2006.01) |
|---|---|
| H01J 37/34 | (2006.01) |
| C23C 14/00 | (2006.01) |
| H01J 37/32 | (2006.01) |
| C23C 14/08 | (2006.01) |
| C23C 14/54 | (2006.01) |

(52) U.S. Cl.
CPC ......... *C23C 14/0063* (2013.01); *C23C 14/081* (2013.01); *C23C 14/3464* (2013.01); *C23C 14/3492* (2013.01); *C23C 14/541* (2013.01); *H01J 37/3244* (2013.01); *H01J 37/32724* (2013.01); *H01J 37/3405* (2013.01)

(58) Field of Classification Search
CPC ............... C23C 14/0063; C23C 14/081; C23C 14/3464; C23C 14/3492; C23C 14/541; H01J 37/3244; H01J 37/32724; H01J 37/3405
USPC ......................... 204/192.12, 192.15, 298.09
See application file for complete search history.

(56) References Cited

U.S. PATENT DOCUMENTS

2013/0288398 A1 10/2013 Yamamoto et al.

FOREIGN PATENT DOCUMENTS

| JP | 10-140342 | * | 5/1998 |
|---|---|---|---|
| JP | 11-152562 | * | 6/1999 |
| WO | 2012086183 A1 | | 6/2012 |

* cited by examiner

*Primary Examiner* — Rodney McDonald

(57) ABSTRACT

A film forming apparatus, for forming a metal oxide film on an object, includes a holding unit and a heating unit. The holding unit includes a first heater and holds the object in a processing chamber. A first heater power supply supplies power to the first heater. A target electrode is electrically connected to a metal target provided above the holding unit. A sputtering power supply is electrically connected to the target electrode. An introduction mechanism supplies an oxygen gas toward the holding unit. The heating unit includes a second heater for heating the object and a moving mechanism for moving the second heater between a region in a first space disposed above the holding unit and a region in a second space separated from the first space. A second heater power supply supplies power to the second heater.

12 Claims, 5 Drawing Sheets

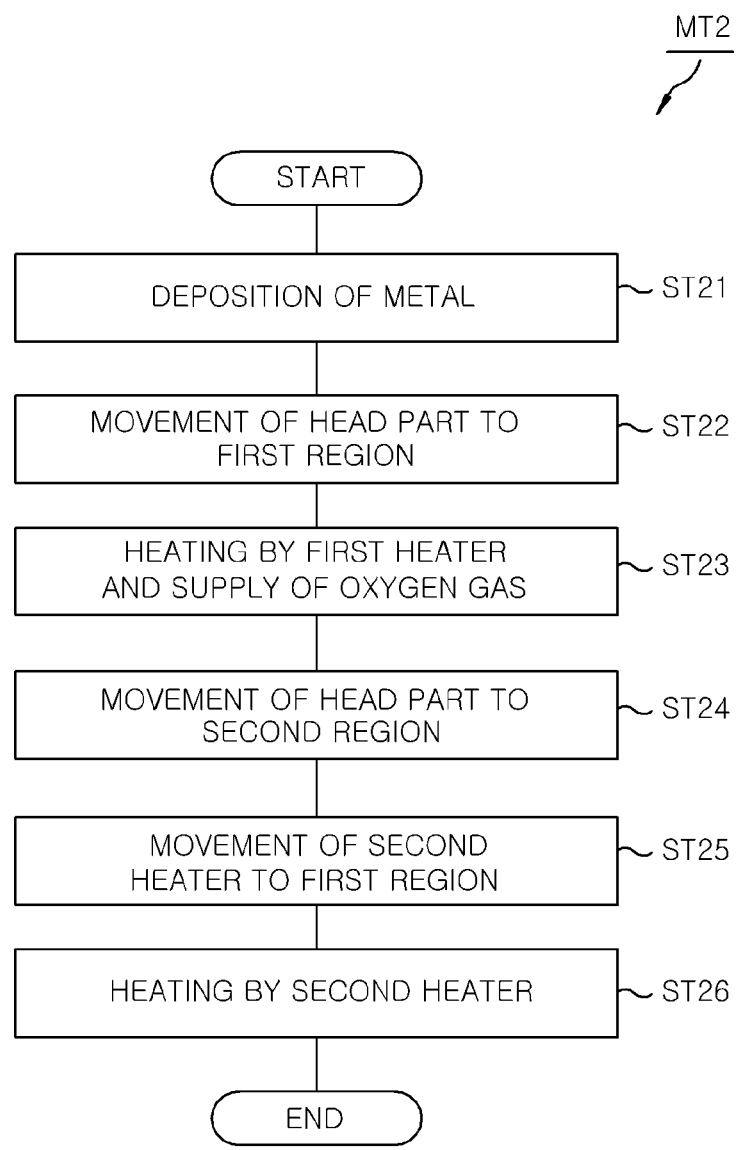

FILM FORMING APPARATUS AND FILM FORMING METHOD

CROSS-REFERENCE TO RELATED APPLICATIONS

This application claims priority to Japanese Patent Application No. 2014-156547 filed on Jul. 31, 2014, the entire contents of which are incorporated herein by reference.

FIELD OF THE INVENTION

The disclosure relates to a film forming apparatus and a film forming method.

BACKGROUND OF THE INVENTION

In manufacturing an electronic device such as a semiconductor device, various treatments are performed on an object to be processed. Film formation is an example of the treatment performed on the object. Sputtering may be used for the film formation.

As for an electronic device, there has been developed a MRAM (Magnetoresistive Random Access Memory) device having a MTJ (Magnetic Tunnel Junction) structure. In the MTJ structure, a magnesium oxide (MgO) layer may be used as a tunnel barrier layer. The MgO layer is generally formed by the following processes. Mg is deposited on an object to be processed by using a sputtering apparatus having a target made of Mg. Next, the object is transferred to an oxidation apparatus connected to the sputtering apparatus via a vacuum transfer apparatus. Then, Mg is oxidized by exposing the target object to an oxidizing gas in the oxidation apparatus. The formation of the MgO layer is disclosed in, e.g., International Publication No. WO2012/086183.

SUMMARY

When an electronic device is manufactured, a high throughput is required. Therefore, when the electronic device includes a metal oxide layer such as an MgO layer or the like, a period of time for forming the metal oxide film needs to be shortened.

It may be required to improve characteristics of the MTJ structure by crystalizing the metal oxide film. In that case, it is required to shorten a period of time for forming and crystallizing the metal oxide film.

In accordance with an aspect of the present invention, there is provided a film forming apparatus for forming a metal oxide film on an object, which includes: a processing chamber; a holding unit, including a first heater, configured to hold the object in the processing chamber; a first heater power supply configured to supply power to the first heater; a target electrode electrically connected to a metal target provided above the holding unit; a sputtering power supply electrically connected to the target electrode; an introduction mechanism configured to supply an oxygen gas toward the holding unit; a heating unit including a second heater for heating the object and a moving mechanism for moving the second heater between a region in a first space disposed above the holding unit and a region in a second space separated from the first space; and a second heater power supply configured to supply power to the second heater.

In accordance with another aspect of the present invention, there is provided a film forming method using the film forming apparatus described above, which includes: depositing a metal sputtered from the metal target on the object; supplying the oxygen gas from the introduction mechanism toward the object while heating the object by the first heater; and heating the object by the second heater provided in the region in the first space.

BRIEF DESCRIPTION OF THE DRAWINGS

The objects and features of the disclosure will become apparent from the following description of embodiments, given in conjunction with the accompanying drawings, in which:

FIG. 5 is a flowchart showing a film forming method according to another embodiment.

DETAILED DESCRIPTION OF THE EMBODIMENTS

Figure 1:
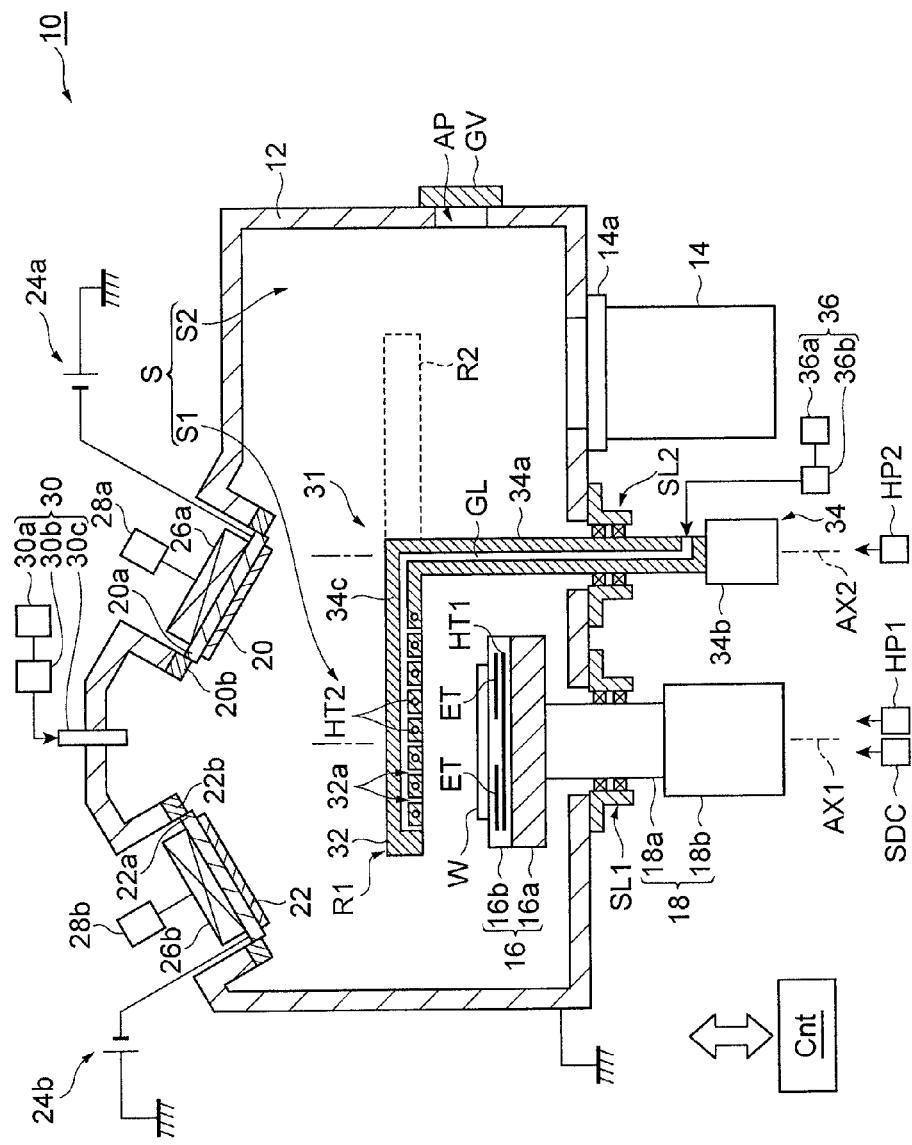
FIG. 1 shows a film forming apparatus according to an embodiment.

Hereinafter, embodiments will be described in detail with reference to the accompanying drawings. Further, like reference numerals will denote the same or corresponding parts in the respective drawings.

FIG. 1 shows a film forming apparatus according to an embodiment. As shown in FIG. 1, a film forming apparatus 10 includes a processing chamber 12. The processing chamber 12 is made of, e.g., aluminum, and connected to a ground potential. The processing chamber 12 has a space S as an inner space thereof. A gas exhaust unit 14 for decreasing a pressure in the space S is connected to a bottom portion of the processing chamber 12 through an adaptor 14a. Formed at a sidewall of the processing chamber 12 is an opening AP through which an object to be processed (hereinafter, may be referred to as "wafer") is transferred. A gate valve GV for opening/closing the opening AP is formed along the sidewall.

The film forming apparatus 10 further includes a holding unit 16 for holding the wafer W. The holding unit 16 is provided in the processing chamber 12. In the present embodiment, the holding unit 16 includes a base part 16a and an electrostatic chuck 16b. The base part 16a is made of, e.g., aluminum, and has a substantially disc shape. In the present embodiment, a temperature control unit may be provided in the base part 16a. For example, a coolant path through which a coolant circulates may be formed in the base part 16a.

The electrostatic chuck 16b is provided on the base part 16a. The electrostatic chuck 16b includes a dielectric film and an electrode ET embedded in the dielectric film. A DC power supply SDC is connected to the electrode ET of the electrostatic chuck 16b. The wafer W mounted on the electrostatic chuck 16b is attracted and held on the electrostatic chuck 16b by an electrostatic force generated by the electrostatic chuck 16b. In the embodiment shown in FIG. 1, the electrostatic chuck 16b is configured as a bipolar electrostatic chuck having two electrodes ET. However, the electrostatic chuck 16b may be configured as a unipolar electrostatic chuck.

The holding unit 16 further includes a heater HT1. In the present embodiment, the heater HT1 is provided in the electrostatic chuck 16b. The heater HT1 has a heating resistance element and is connected to a heater power supply HP1. The heater HT1 generates heat by power from the heater power supply HP1. As a consequence, the wafer W is heated. The heater HT1 serves as a first heater used for oxidizing a metal deposited on the wafer W. In other words, the heater HT1 is used for performing heating for converting the metal film formed on the wafer W into the metal oxide film. For example, when the metal is magnesium (Mg), the heater HT1 heats the wafer W to a temperature ranging from about 80° C. to 200° C.

The holding unit 16 is connected to a driving mechanism 18. The driving mechanism 18 includes a supporting shaft 18a and a driving unit 18b. The supporting shaft 18a extends downwardly from the holding unit 16 to the outside of the processing chamber 12 through the bottom portion of the processing chamber 12. A sealing member SL1 is provided between the supporting shaft 18a and the bottom portion of the processing chamber 12. The sealing member SL1 seals a gap between the bottom portion of the processing chamber 12 and the supporting shaft 18a such that the supporting shaft 18a can be rotated, raised and lowered (vertically moved). The sealing member SL1 may be, e.g., a magnetic fluid seal.

The supporting shaft 18a has one end coupled to the holding unit 16 and the other end connected to the driving unit 18b. The driving unit 18b generates driving forces for rotating and vertically moving the supporting shaft 18a. The holding unit 16 rotates about an axis AX1 by the rotation of the supporting shaft 18a. The holding unit 16 is vertically moved by the vertical movement of the supporting shaft 18a. The axis AX1 extends in a vertical direction and substantially coincides with a central axis of the supporting shaft 18a.

Metal targets 20 and 22 are provided above the holding unit 16. In the case of forming a barrier film having a MTJ structure, targets made of Mg (Mg targets) are used as the metal targets 20 and 22. The metal targets 20 and 22 may be selected depending on types of a metal oxide film to be formed. The number of metal targets of the film forming apparatus 10 is not limited to two and may be one or more.

The metal targets 20 and 22 are respectively attached to target electrodes 20a and 22a each made of a metal. Therefore, the metal targets 20 and 22 are electrically connected to the target electrodes 20a and 22a, respectively. The target electrodes 20a and 22a are held at a ceiling portion of the processing chamber 12 through insulating members 20b and 22b, respectively.

A power supply 24a is connected to the metal target 20 via the target electrode 20a. A power supply 24b is connected to the metal target 22 via the target electrode 22a. The power supplies 24a and 24b may be configured as DC power supplies or AC power supplies. A cathode magnet 26a is provided at the outside of the processing chamber 12 to face the metal target 20 with the target electrode 20a therebetween. A cathode magnet 26b is provided at the outside of the processing chamber 12 to face the metal target 22 with the target electrode 22a therebetween. Magnet driving units 28a and 28b are connected to the cathode magnets 26a and 26b, respectively.

The film forming apparatus 10 includes a gas supply unit 30 for supplying a gas into the processing chamber 12. In the present embodiment, the gas supply unit 30 includes a gas source 30a, a flow rate controller 30b such as a mass flow controller, and a gas inlet 30c. The gas source 30a is a source of a gas to be excited in the processing chamber 12. For example, the gas source 30 is a source of an inert gas such as a rare gas, e.g., Ar gas or the like. The gas source 30a is connected to the gas inlet 30c via the flow rate controller 30b. The gas inlet 30c is a gas line for introducing a gas from the gas source 30a into the processing chamber 12. In the present embodiment, the gas inlet 30c extends along the axis AX.

The gas is supplied from the gas supply unit 30. The gas supplied into the processing chamber 12 is excited by applying a voltage from the power supply 24a and/or the power supply 24b to the metal target 20 and/or the metal target 22. When the cathode magnet 26a and/or the cathode magnet 26b is driven by the magnet driving unit 28a and/or the magnet driving unit 28b, a magnetic field is generated around the metal targets 20 and 22. Accordingly, a plasma is concentrated near the metal target 20 and/or the metal target 22. Positive ions in the plasma collide with the metal target 20 and/or the metal target 22, so that substances forming the metal target 20 and/or the metal target 22 are sputtered therefrom. Accordingly, the metal forming the metal target 20 and/or the metal target 22 is deposited on the wafer W.

The film forming apparatus 10 further includes an introduction mechanism 31. The introduction mechanism 31 has a head part 32 and a moving mechanism 34. The introduction mechanism 31 is configured to supply an oxygen gas for oxidizing the metal deposited on the wafer W toward the holding unit 16.

The head part 32 is connected to the moving mechanism 34 for pivotally supporting the head part 32. In the present embodiment, the moving mechanism 34 has a supporting shaft 34a and a driving unit 34b. The supporting shaft 34a extends along an axis AX2. The axis AX2 extends substantially in parallel to the axis AX1 and extends in the vertical direction at a side of the holding unit 16. In the present embodiment, the head part 32 has a substantially disc shape. A distance from the center of the head part 32 to the axis AX2 is substantially equal to a distance from the axis AX1 to the axis AX2.

The supporting shaft 34a extends from the inside of the processing chamber 12 to the outside of the processing chamber 12. A sealing member SL2 is provided between the supporting shaft 34a and the bottom portion of the processing chamber 12. The sealing member SL2 seals a gap between the bottom portion of the processing chamber 12 and the supporting shaft 34a such that the supporting shaft 34a can be rotated. The sealing member SL2 may be, e.g., a magnetic fluid seal.

An upper end of the supporting shaft 34a is connected to one end of a connecting part 34c extending in a direction perpendicular to the axis AX2. The other end of the connecting part 34c is coupled to a peripheral portion of the head part 32. A lower end of the supporting shaft 34a is connected to the driving unit 34b. The driving unit 34b generates a driving force for rotating the supporting shaft 34a. The head part 32 is pivoted about the axis AX2 by the rotation of the supporting shaft 34a.

Specifically, the head part 32 is moved between a region R1 and a region R2 by the operation of the moving mechanism 34. The space S in the processing chamber 12 includes a first space S1 and a second space S2. The first space S1 is disposed above the holding unit 16 and between the metal targets 20 and 22 and the holding unit 16. The second space S2 is separated from the first space S1. The region R1 is within the first space S1 and the region R2 is within the second space S2.

An oxidizing gas line GL is formed in the supporting shaft 34a, the connecting part 34c and the head part 32. One end of the gas line GL is disposed at the outside of the processing chamber 12 and connected to the gas supply unit 36. The gas supply unit 36 forms a part of the introduction mechanism 31. The gas supply unit 36 includes a gas source 36a and a flow rate controller 36b such as a mass flow controller. The gas source 36a is a source of an oxygen gas, e.g., $O_2$ gas. The gas source 36a is connected to one end of the gas line GL via the flow rate controller 36b.

In the head part 32, the gas line GL is connected to a plurality of gas injection holes 32a formed in the head part 32. The gas injection holes 32a are opened downward, i.e., toward the holding unit 16, to inject an oxygen gas. The gas injection holes 32a may be formed in the head part 32 so as to be distributed two-dimensionally. Or, the gas injection holes 32a may be formed in the head part 32 so as to be distributed in a direction perpendicular to the axis AX2. The head part 32 may have an elongated planar shape extending in the arrangement direction of the gas injection holes 32a.

A heater HT2 is provided at the head part 32. The heater HT2 and the moving mechanism 34 constitute a heating unit of the present embodiment. The heater HT2 may use any one of various types of heating method such as lamp emission, Joule resistance heating, induction heating, microwave heating and the like. A heater power supply HP2 is connected to the heater HT2. The heater HT2 generates heat by power from the heater power supply HP2. In the present embodiment, the heater HT2 serves as a second heater used for performing heating for crystallizing the metal oxide film formed on the wafer W. For example, when the metal is Mg, the heater HT2 heats the wafer W to a temperature ranging from about 250° C. to 400° C. The heater HT2 may also be used for heating an oxygen gas supplied from the head part 32. Accordingly, it is possible to shorten a period of time for oxidizing the metal.

In the film forming apparatus 10 configured as described above, the deposition of the metal on the wafer W and the oxidation of the metal layer can be performed in the same processing chamber 12. Also, the crystallization of the metal oxide film can be performed in the same processing chamber 12. Specifically, in a state where the head part 32 is positioned at the region R2 shown in FIG. 1, the metal sputtered from the metal target 20 and/or the metal target 22 can be deposited on the wafer W. Next, in a state where the head part 32 is positioned at the region R1, an oxygen gas can be supplied from the head part 32 toward the wafer W while heating the wafer W by the heater HT1. As a consequence, the metal is oxidized and the meal oxide film can be formed in a short period of time. Then, the wafer W can be heated by the heater HT2. Accordingly, the metal oxide film can be crystallized. The heat capacity of the head part 32 where the heater HT2 is provided is smaller than that of the holding unit 16. Therefore, the head part 32 can be heated in a short period of time and, further, the metal oxide film can be crystallized in a short period of time.

In the present embodiment, the film forming apparatus 10 may further include a control unit Cnt as shown in FIG. 1. The control unit Cnt may be a computer including a processor, a storage unit, an input device, a display device and the like. The control unit Cnt controls the respective components of the film forming apparatus 10. Specifically, the control unit Cnt controls the heater power supplies HP1 and HP2, the power supplies 24a and 24b, and the driving unit 34b. In this control unit Cnt, an operator can input commands to manage the film forming apparatus 10 by using the input device and an operation state of the film forming apparatus 10 can be visually displayed on the display device. The storage unit of the control unit Cnt stores therein a control program for controlling various processes performed in the film forming apparatus 10 by using the processor, or a program, i.e., a processing recipe, for performing processes of the respective components of the film forming apparatus 10 under a processing condition.

Figure 2:
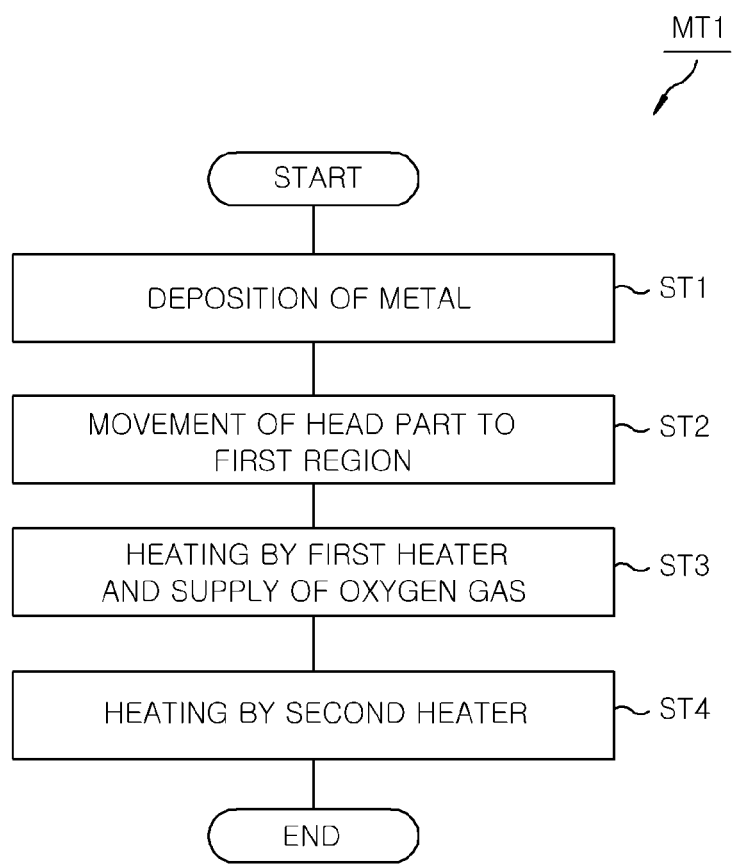
FIG. 2 is a flowchart showing a film forming method according to an embodiment.

Hereinafter, a film forming method according to an embodiment which can be performed by using the film forming apparatus 10 will be described. FIG. 2 is a flowchart showing the film forming method according to the embodiment. A method MT1 shown in FIG. 2 includes steps ST1 to ST4.

Before the step ST1 of the method MT1 is executed, the wafer W is transferred into the processing chamber 12 and held by the holding unit 16. The head part 32 is positioned at the region R2.

Then, the step ST1 of the method MT1 is executed. In the step ST1, a metal is deposited on the wafer W. Specifically, a gas is supplied from the gas supply unit 30 into the processing chamber 12. The gas exhaust unit 14 operates, so that a pressure in the space S in the processing chamber 12 is decreased to a predetermined level. A voltage is applied from the power supply 24a and/or the power supply 24b to the metal target 20 and/or the metal target 22. As a consequence, the metal is sputtered from the metal target 20 and/or the metal target 22 and the sputtered metal is deposited on the wafer W. In the present embodiment, the operations of the respective components of the film forming apparatus 10 in the step ST1 are controlled by the control unit Cnt. Specifically, the control unit Cnt performs a first control to execute the step ST1. The first control allows the gas supply unit 30 to supply a gas into the processing chamber 12 and the gas exhaust unit 14 to reduce a pressure in the space inside the processing chamber 12. Further, the first control allows the power supplies 24a and 24b to apply a voltage to the metal targets 20 and 22, respectively.

In the step ST2, the driving unit 34b is driven to move the head part 32 to the region R1 in the first space S1. In the present embodiment, the operation of the driving unit 34b in the step ST2 can be controlled by the control unit Cnt.

Next, in the step ST3, an oxygen gas is supplied from the head part 32 to the wafer W while heating the wafer W by the heater HT1. Specifically, the power is supplied from the heater power supply HP1 to the heater HT1, and the oxygen gas is supplied from the gas supply unit 36. The heater HT1 heats the wafer W to a temperature ranging from, e.g., 80° C. to 200° C. In the present embodiment, the operations of the respective components of the film forming apparatus 10 in the step ST3 are controlled by the control unit Cnt. Specifically, the control unit Cnt performs a second control to execute the step ST3. The second control allows the heater power supply HP1 to supply the power to the heater HT1 and the gas supply unit 36 to supply an oxygen gas. By executing the step ST3, the metal deposited on the wafer W is oxidized and a metal oxide film is formed. In the step ST3, the wafer W is heated when the metal is oxidized, so that a period of time for oxidizing the metal can be shortened. The power may be supplied from the heater power supply HP1 to the heater HT1 throughout the entire process. In other words, the heater HT1 may be constantly in an ON state (heat generation state). Further, in the step ST3, the oxygen gas may be heated by the heater HT2.

Next, in the step ST4, the wafer W is further heated by the heater HT2. Specifically, the power is supplied from the heater power supply HP2 to the heater HT2. As a consequence, the metal oxide film is crystallized. In the step ST4, the wafer W is heated by the heater HT2 to a temperature ranging from, e.g., 250° C. to 400° C. In the present embodiment, the operations of the respective components of the film forming apparatus 10 in the step ST4 are controlled by the control unit Cnt. Specifically, the control unit Cnt performs a third control to execute the step ST4. The third control allows the heater power supply HP2 to supply the power to the heater HT2. The power may be supplied from the heater power supply HP2 to the heater HT2 throughout the entire process. In other words, the heater HT2 may be constantly in an ON state (heat generation state).

In the method MT1, the steps ST1, ST3 and step ST4 can be executed by using the same film forming apparatus 10 in a state where the wafer W is accommodated in the processing chamber 12. Therefore, it is possible to shorten a period of time required for forming and crystallizing the metal oxide film. The steps ST1 to ST3 may be repeated multiple times. In that case, the step ST4 is executed after the steps ST1 to ST3 are repeated multiple times.

Figure 3:
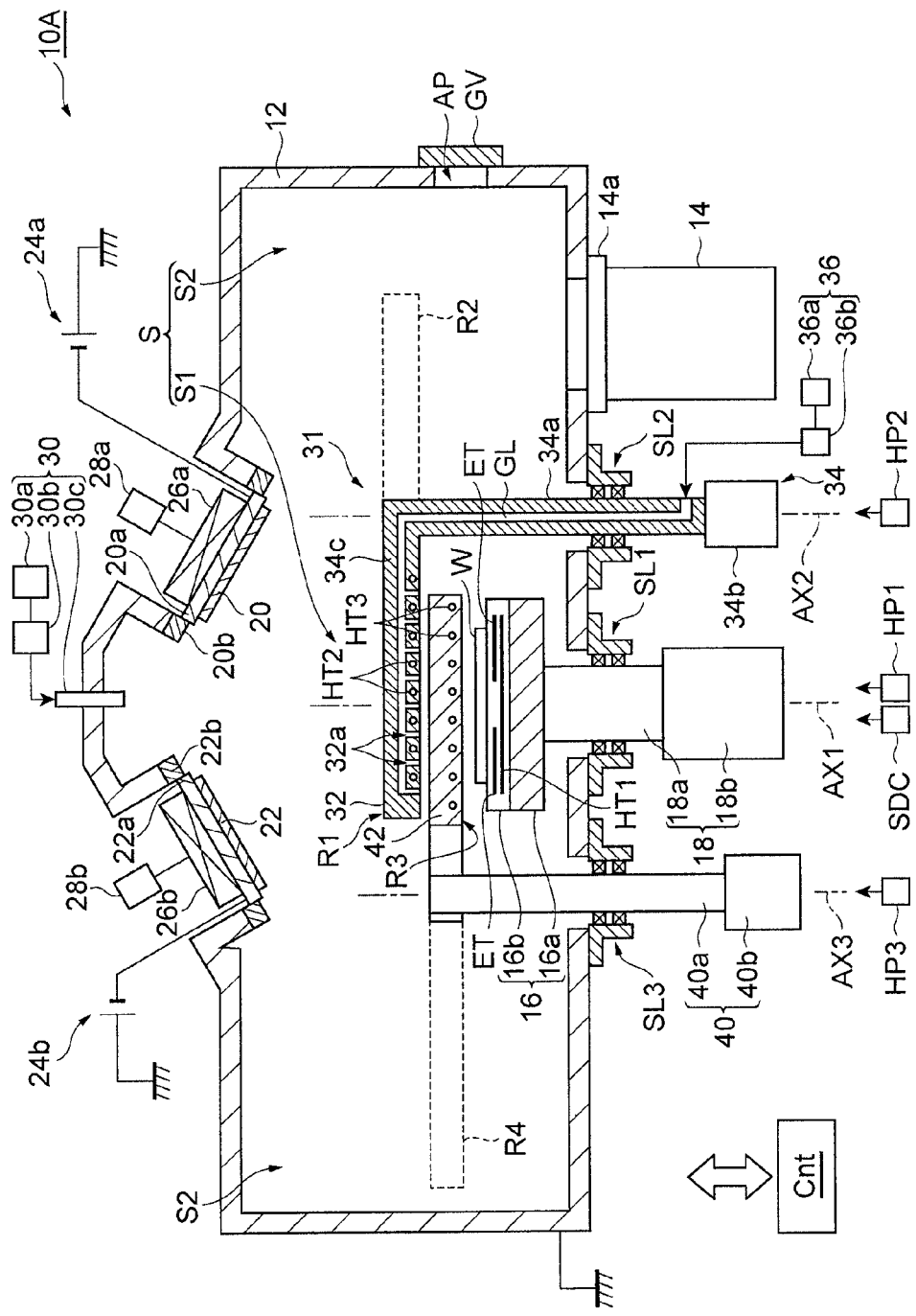
FIG. 3 shows a film forming apparatus according to another embodiment.

Hereinafter, another embodiment will be described. FIG. 3 shows a film forming apparatus according to another embodiment. A film forming apparatus 10A shown in FIG. 3 includes a heater HT3 and a heater power supply HP3 in addition to the components of the film forming apparatus 10.

The heater HT3 may use any one of various types of heating method such as lamp emission, Joule resistance heating, induction heating, microwave heating and the like. In the present embodiment, the heater HT3 serves as the second heater used for performing heating for crystallizing the metal oxide film. In the present embodiment, the heater HT2 is used for heating an oxygen gas.

The heater HT3 is connected to the heater power supply HP3. The heater HT3 is provided at the head part 42. In the present embodiment, the head part 42 has a substantially disc shape.

The head part 42 is connected to the moving mechanism 40 for pivotally supporting the head part 42. In the present embodiment, the moving mechanism 40 has a supporting shaft 40a and a driving unit 40b. The supporting shaft 40a extends along an axis AX3. The axis AX3 extends substantially in parallel to the axes AX1 and AX2 and extends in the vertical direction at a side of the holding unit 16.

The supporting shaft 40a extends from the inside of the processing chamber 12 to the outside of the processing chamber 12. A sealing member SL3 is provided between the supporting shaft 40a and the bottom portion of the processing chamber 12. The sealing member SL3 seals a gap between the bottom portion of the processing chamber 12 and the supporting shaft 40a such that the supporting shaft 40a can be rotated. The sealing member SL3 may be, e.g., a magnetic fluid seal.

An upper end of the supporting shaft 40a is connected to the head part 42. A lower end of the supporting shaft 40a is connected to the driving unit 40b. In the present embodiment, the operation of the driving unit 40b of the moving mechanism 40 can be controlled by the control unit Cnt. The driving unit 40b generates a driving force for rotating the supporting shaft 40a. The head part 42 is pivoted about the axis AX3 by the rotation of the supporting shaft 40a.

Specifically, the head part 42 is moved between a region R3 and a region R4 by the operation of the moving mechanism 40. The region R3 is within the first space S1 and the region R4 is within the second space S2. The head part 42 is positioned at the region R4 during the deposition of the metal on the wafer W and the oxidation of the metal. The head part 42 is positioned at the region R3 during the crystallization of the metal oxide film. The heater used for crystallizing the metal oxide film may be moved by a moving mechanism different from the moving mechanism for the head part 32 for supplying an oxygen gas.

In the present embodiment, the region R3 (second region) is closer to the holding unit 16, compared to the region R1 (first region). In other words, the location of the heater HT3 in the first space S1 is closer to the holding unit 16, compared to the location of the head part 32 in the first space S1. Accordingly, the heater HT3 can be made to become close to the holding unit 16 and further to the wafer W. As a result, the metal oxide film can be effectively heated.

Figure 4:
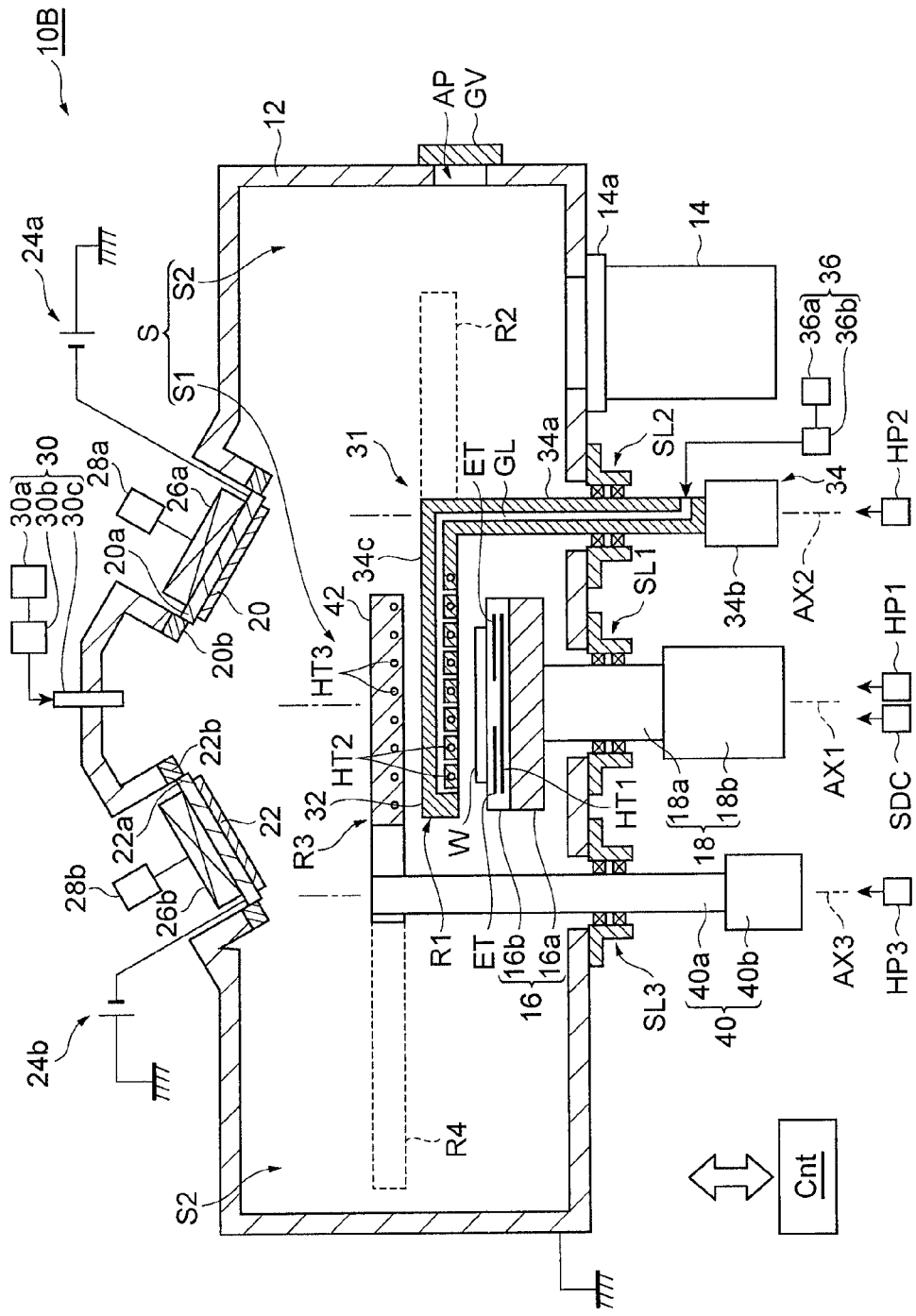
FIG. 4 shows a film forming apparatus according to still another embodiment.

Hereinafter, still another embodiment will be described. FIG. 4 shows a film forming apparatus according to still another embodiment. A film forming apparatus 10B shown in FIG. 4 is different from the film forming apparatus 10A except that the region R1 (first region) where the head part 32 is located in the first space S1 is closer to the holding unit 16, compared to the region R3 (second region) where the heater HT3 is located in the first space S1. In other words, in the film forming apparatus 10B, the moving mechanism 34 can move the head part 32 to a position lower than the heater HT3.

Hereinafter, a film forming method according to another embodiment which can be performed by using the film forming apparatus 10A or the film forming apparatus 10B will be described. FIG. 5 is a flowchart showing the film forming method according to another embodiment. A method MT2 shown in FIG. 5 includes steps ST21 to ST26.

Before the step ST21 of the method MT2 is executed, the wafer W is transferred into the processing chamber 12 and held by the holding unit 16. The head part 32 and the head part 42 are positioned at the second space S2. Specifically, the head part 32 is positioned at the region R2 and the head part 42 is positioned at the region R4.

Then, the step ST21 of the method MT2 is executed. The step ST21 is the same as the step ST1.

Next, in the step ST22, the head part 32 is moved to the region R1 in the first space S1. The step ST22 is the same as the step ST2.

Thereafter, in the step ST23, an oxygen gas is supplied from the head part 32 to the wafer W while heating the wafer W by the heater HT1. The step ST23 is the same as the step ST3.

Next, in the step ST24, the head part 32 is moved to the region R2 in the second space S2. In the step ST24, the driving unit 34b is driven to move the head part 32 to the region R2 in the second space S2. In the present embodiment, the operation of the driving unit 34b in the step ST24 can be controlled by the control unit Cnt.

Then, in the step ST25, the heater HT3, e.g., the head part 42, is moved to the region R3 in the first space S1. In the step ST25, the driving unit 40b is driven to move the head part 42 to the region R3 in the first space S1. In the present embodiment, the operation of the driving unit 40b in the step ST25 can be controlled by the control unit Cnt.

Thereafter, in the step ST26, the wafer W is further heated by the heater HT3. Specifically, the power is supplied from the heater power supply HP3 to the heater HT3. As a consequence, the metal oxide film is crystallized. In the step ST26, the wafer W is heated by the heater HT3 to a temperature ranging from, e.g., 250° C. to 400° C. In the present embodiment, the operation of the heater power supply HP3 in the step ST26 can be controlled by the control unit Cnt. Specifically, the control unit Cnt performs third control to execute the step ST26. The third control allows the heater power supply HP3 to supply the power to the heater HT3.

In the method MT2, the steps ST21 to ST24 may be repeated multiple times. In that case, the steps ST25 and ST26 may be executed after the steps ST21 to ST24 are repeated multiple times.

In the case of using the film forming apparatus 10B in the method MT2, it is possible to move the heater HT3 to the region R3 in the step ST22 and heat the head part 32 by the heater HT3 in the step ST23. In that case, the oxygen gas in the head part 32 can be heated by the heater HT3, so that the film forming apparatus 10B may not include the heater HT2. Further, In that case, the heater HT3 is moved toward the region R3 in the step ST22, so that the step ST25 becomes unnecessary.

While various embodiments have been described, the disclosure may be variously modified without being limited to the above-described embodiments. For example, the head part 32 and/or the head part 42 may be moved between the region in the first space S1 and the region in the second space S2 while making parallel movement perpendicular to the vertical direction. Further, the film forming apparatus 10A shown in FIG. 3 and the film forming apparatus 10B shown in FIG. 4 may include any one of the heater HT1 and the heater HT2.

While the disclosure has been shown and described with respect to the embodiments, it will be understood by those skilled in the art that various changes and modifications may be made without departing from the scope of the disclosure as defined in the following claims.

What is claimed is:

1. A film forming apparatus for forming a metal oxide film on an object, comprising:
   a processing chamber;
   a holding unit, including a first heater, configured to hold the object in the processing chamber;
   a first heater power supply configured to supply power to the first heater;
   a target electrode electrically connected to a metal target provided above the holding unit;
   a sputtering power supply electrically connected to the target electrode;
   an introduction mechanism configured to supply an oxygen gas toward the holding unit;
   a heating unit including a second heater for heating the object and a moving mechanism for moving the second heater between a region in a first space disposed above the holding unit and a region in a second space separated from the first space; and
   a second heater power supply configured to supply power to the second heater.

2. The film forming apparatus of claim 1, wherein the introduction mechanism includes a head part having gas injection holes for injecting the oxygen gas toward the holding unit,
   wherein the second heater is provided at the head part, and
   wherein the moving mechanism moves the head part between the region in the first space and the region in the second space.

3. The film forming apparatus of claim 1, wherein the introduction mechanism includes:
   a head part having gas injection holes configured to inject the oxygen gas toward the holding unit; and
   an additional moving mechanism configured to move the head part between the region in the first space and the region in the second space.

4. The film forming apparatus of claim 3, wherein the additional moving mechanism moves the head part to a first region in the first space, and
   wherein the moving mechanism of the heating unit moves the second heater to a second region in the first space, which is closer to the holding unit compared to the first region.

5. The film forming apparatus of claim 3, wherein the additional moving mechanism moves the head part to a first region in the first space,
   wherein the moving mechanism of the heating unit moves the second heater to a second region in the first space, and
   wherein the first region is closer to the holding unit compared to the second region.

6. The film forming apparatus of claim 1, further comprising a control unit for controlling the first heater power supply, the second heater power supply, the sputtering power supply, the introduction mechanism, and the moving mechanism of the heating unit,
   wherein the control unit performs:
   a first control of controlling the sputtering power supply to apply a voltage to the target electrode;
   a second control of controlling the introduction mechanism to supply the oxygen gas and the first heater power supply to supply power to the first heater; and
   a third control of controlling the second heater power supply to supply power to the second heater provided in the region in the first space.

7. The film forming apparatus of claim 1, wherein the metal target is an Mg target.

8. A film forming method using a film forming apparatus comprising:
   a processing chamber;
   a holding unit, including a first heater, configured to hold the object in the processing chamber;
   a first heater power supply configured to supply power to the first heater;
   a target electrode electrically connected to a metal target provided above the holding unit;
   a sputtering power supply electrically connected to the target electrode;
   an introduction mechanism configured to supply an oxygen gas toward the holding unit;
   a heating unit including a second heater for heating the object and a moving mechanism for moving the second heater between a region in a first space disposed above the holding unit and a region in a second space separated from the first space; and
   a second heater power supply configured to supply power to the second heater;
   the film forming method comprising:
   depositing a metal sputtered from the metal target on the object;
   supplying the oxygen gas from the introduction mechanism toward the object while heating the object by the first heater; and
   heating the object by the second heater provided in the region in the first space.

9. The film forming method of claim 8, wherein in said supplying the oxygen gas, the object is heated to a temperature ranging from 80° C. to 200° C., and
   wherein in said heating the object by the second heater, the object is heated to a temperature ranging from 250° C. to 400° C.

10. The film forming method of claim 8, wherein the metal target is an Mg target.

11. The film forming method of claim 8,
wherein the introduction mechanism includes a head part having gas injection holes for injecting the oxygen gas toward the holding unit,
wherein the second heater is provided at the head part, and
wherein the moving mechanism moves the head part between the region in the first space and the region in the second space,
wherein in said depositing the metal, the head part is disposed in the region in the second space, and
wherein the method further includes:
moving the head part from the region in the second space to the region in the first space between said depositing the metal and said supplying the oxygen gas.

12. A film forming method of claim 8,
wherein the introduction mechanism includes:
   a head part having gas injection holes configured to inject the oxygen gas toward the holding unit; and
   an additional moving mechanism configured to move the head part between the region in the first space and the region in the second space;
wherein in said depositing the metal, the head part and the second heater are provided in the region in the second space, and
wherein the method further includes:
moving the head part from the region in the second space to the region in the first space between said depositing the metal and said supplying the oxygen gas; and
moving the second heater to the region in the first space between said supplying the oxygen gas and said heating the object.

* * * * *